United States Patent [19]

Redfield

[11] Patent Number: 5,377,176
[45] Date of Patent: Dec. 27, 1994

[54] METHOD AND APPARATUS FOR ISOLATING DATA STORAGE REGIONS IN A THICK HOLOGRAPHIC STORAGE MEDIA

[75] Inventor: Stephen R. Redfield, Austin, Tex.

[73] Assignee: Tamarack Storage Devices, Austin, Tex.

[21] Appl. No.: 91,311

[22] Filed: Jul. 14, 1993

[51] Int. Cl.$^5$ ............................................. G11B 7/26
[52] U.S. Cl. ................................... 369/103; 369/112; 369/283
[58] Field of Search .............. 369/275.1, 275.2, 275.3, 369/275.4, 103, 109, 112, 283, 286; 359/15.1; 430/14, 15

[56] References Cited

U.S. PATENT DOCUMENTS 4,998,236  3/1991  Henshaw ............................ 369/103
5,255,262  10/1993  Best et al. ....................... 369/275.1

*Primary Examiner*—Paul M. Dzierzynski
*Assistant Examiner*—Don Wong
*Attorney, Agent, or Firm*—Ross, Howison, Clapp & Korn

[57] ABSTRACT

A holographic storage media for storing digital data in the form of an interference grating is provided which includes a plurality of slabs of photorefractive material (72) arranged in a stack, with one edge thereof comprising an incident face (74). A data beam (39) having data superimposed thereon and a reference beam (38) are input to the face (74) to record a holographic image of the data in one of the slabs (72). Each of the slabs has a plurality of adjacent storage regions formed therein. The data and reference beams are disposed in a plane perpendicular to both the face (74) and the side (75) of the slabs (72), such that the reference beam (38) is confined within the slab (72) for all angles of the reference beam (38).

9 Claims, 4 Drawing Sheets

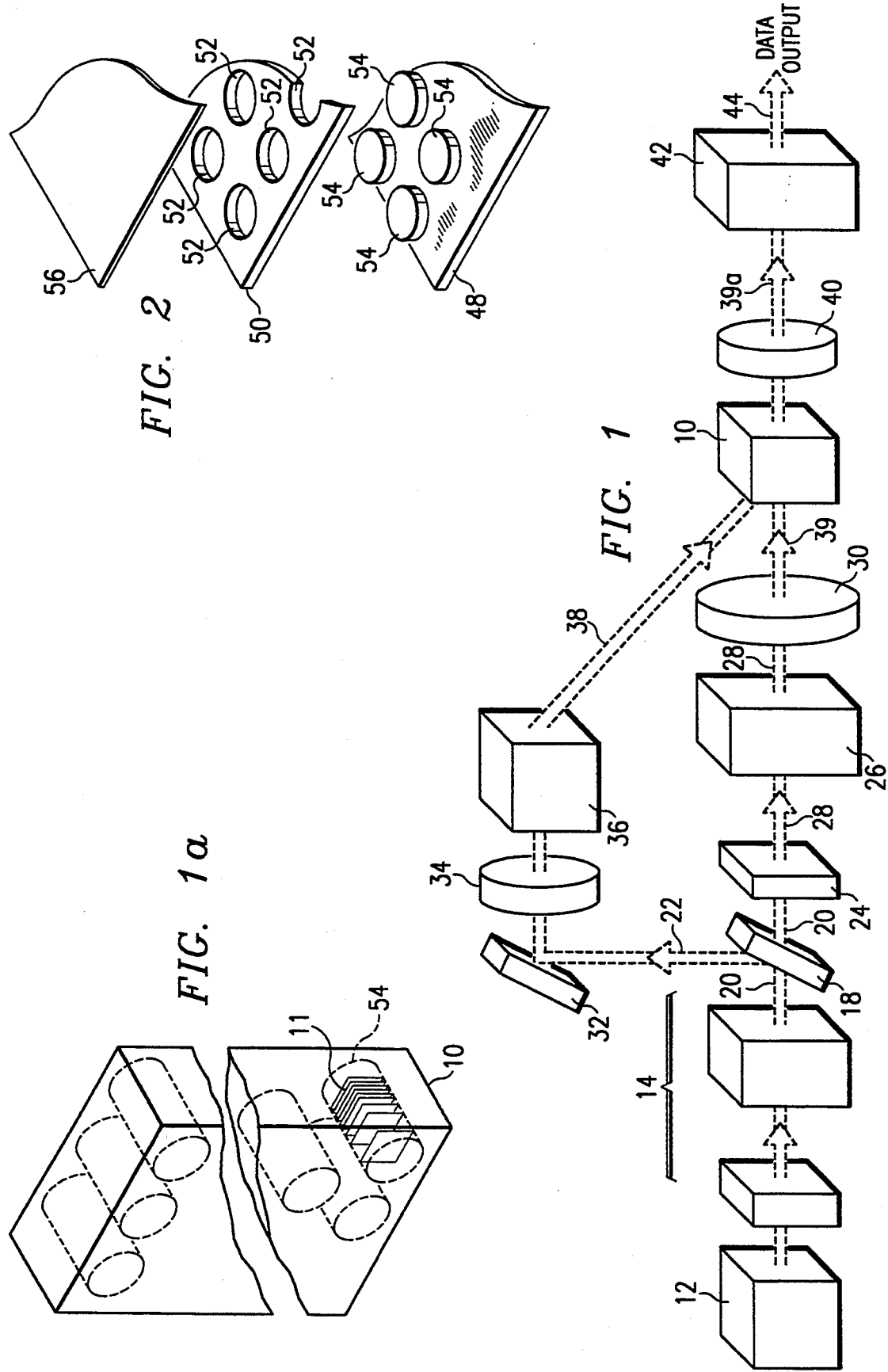

METHOD AND APPARATUS FOR ISOLATING DATA STORAGE REGIONS IN A THICK HOLOGRAPHIC STORAGE MEDIA

TECHNICAL FIELD OF THE INVENTION

The present invention pertains in general to holographic memories and, more particularly, to the storage media and the technique for increasing the density of storage regions on the storage media.

CROSS REFERENCE TO RELATED APPLICATIONS

This application is related to U.S. patent application Ser. No. 08/139,284, filed concurrent herewith, and entitled "Method and Apparatus for Isolating Data Storage Regions in a Thin Holographic Storage Media".

BACKGROUND OF THE INVENTION

As the need for increased data storage changes, the search for higher density, faster access memory technologies also increases. One of these, holographic data storage, provides the promise for increased access to higher density data. The techniques tier realizing such storage typically utilize some type of storage media, such as photorefractive crystals or photopolymer layers, to store 3-D "stacks" of data in the form of pages of data. Typically, coherent light beams from lasers are utilized to perform the addressing, writing and reading of the data from the storage media by directing these beams at a specific region on the surface of the media. Writing is achieved by remembering the interference pattern formed by these beams at this region. Reading is achieved by detecting a reconstructed light beam as it exits the storage medium, the data then being extracted therefrom. Addressing is achieved by the positioning of the laser beams, and this is typically done through the use of mirrors and lenses; however, the storage media itself can be moved relative to fixed laser beams.

One of the limiting aspects to the density of storage in the storage media is the physical separation between storage areas. A storage area or region is typically defined by the intersecting diameters of two beams. When these beams impinge upon a given area, the data is stored within the intersecting or overlapping area of the two beams and contained within the underlying structure of the media. The useful recording portion of the media is therefore confined to the overlap area. However, in actuality, parts of each beam will spread out beyond the overlap area. This will expose the media with useless information. Further, the overlap area may contain too much information and could be made smaller, such that it may be desirable to clip or aperture the overlap area. Therefore, some type of guard ring or region is desirable between storage regions.

Another aspect to be considered when dealing with adjacent regions in media such as photopolymer materials, is the diffusion of monomers within the media. Whenever one region is subjected to a Write operation, there will be some migration of monomers in the material, this being necessary to obtain contrast in the recording. Ideally, it would be desirable to locally confine this migration to the area of the recording. However, since the material is relatively homogenous and all regions are contiguous, migration of monomers can occur between recording regions.

SUMMARY OF THE INVENTION

The present invention disclosed and claimed herein comprises an optical storage system for recording data in a thick holographic storage medium. The holographic storage medium is comprised of a plurality of slabs of holographic storage media. Each of the slabs of the storage media has two parallel sides and an incident face disposed perpendicular thereto. The incident face is operable to receive a reference and a data beam. A diametrically opposed face to the incident face is separated therefrom by the parallel sides and allows the data and reference beams to exit from the storage media. The storage media is operable to store data in interference gratings that are formed by the interference between received data and reference beams within the storage medium. The stored data is read out by passing a reference laser beam therethrough at substantially the same angle of reference beam that the data was recorded at. Each of the slabs has a plurality of storage regions associated therewith defining specific areas within the slab at which data is stored. A support structure is provided for disposing the slabs in an adjacent relationship with the parallel sides of adjacent ones of the slabs disposed a predetermined distance apart. The slabs are oriented such that both the parallel sides and the incident faces of the slabs are oriented perpendicular to a plane of the data and reference laser beams.

In another aspect of the present invention, the slabs are fabricated from a photorefractive crystalline material. Each of the selected storage regions is selectively addressable for the Read/Write operation. Electrodes are provided on the portion of the two sides associated with each of the storage regions within each of the slabs to allow the storage regions to be selectively accessed.

BRIEF DESCRIPTION OF THE DRAWINGS

For a more complete understanding of the present invention and the advantages thereof, reference is now made to the following description taken in conjunction with the accompanying Drawings in which:

FIG. 1 illustrates an overall block diagram of a holographic storage assembly;

FIG. 1a illustrates a detail of the recording media;

FIG. 2 illustrates an exploded view of one embodiment of the present invention illustrating the perforated structure that forms the isolation structure in which photopolymer material is disposed, the perforations defining the recording regions;

DETAILED DESCRIPTION OF THE INVENTION

Figure 3:
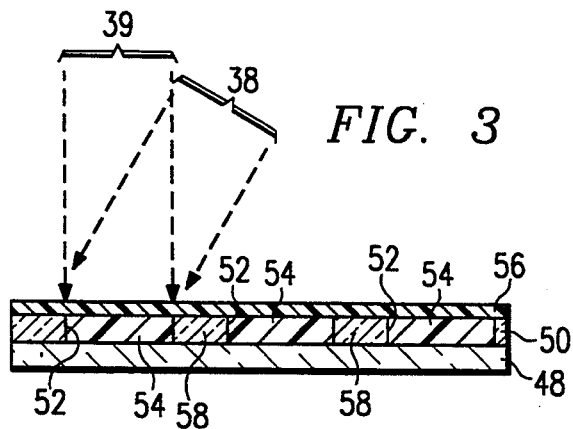
FIG. 3 illustrates a cross-sectional view of the structure of FIG. 2 after assembly thereof and with a data beam and a reference beam impinging on the surface thereof.

Referring now to FIG. 1, there is illustrated a holographic storage assembly which is operable to store data in a transparent holographic storage recording media 10 and extract that data therefrom. The data is organized in the recording media as an array of stacks of pages 11 (images). This is illustrated in FIG. 1a, wherein each of the stacks of pages 11 occupies a small region 54 of the recording media 10, with each of the pages in each of the regions 54 comprising an interference grating, all of the interference gratings in a given region 54 superimposed over each other. A laser 12 is provided, which can be comprised of, for example, a diode-pumped YAG (yttrium aluminum garnet) laser with a power output of around 80 milliwatts, with a wavelength in the range of 532 nanometers. The output beam of the laser is processed by a stack-selector assembly 14 which steers the beam to the location of an individual stack of pages 11 in the recording media 10. The output of the stack selector assembly 14 is then passed to a beam splitter 18 which separates the beam into two beams, a data beam 20 and a reference beam 22.

The data beam 20 is expanded by a beam expander 24 which is then input to a Spatial Light Modulator (SLM) 26 to output an expanded data beam 28. The SLM 26 receives data from a computer system (not shown) and then this data is superimposed on the expanded data beam 28 by the SLM 26, creating a bit pattern of light and dark spots in the conventional manner. This pattern of spots represents the bits on the page to be stored. After the SLM 26, the data beam is then passed through a focusing system 30 which then focuses the beam onto a select portion of the surface of the holographic storage media 10. This focused data beam 39 is the Fourier transform of the pattern of spots, or page.

The reference beam 22 is reflected from a mirror 32 and then passed through a polarization rotator 34, the polarization orientation dictated by an external control signal. This rotator is utilized to adjust the polarization of the reference beam 22 during a read operation. The output of the polarization rotator 34 is then input to a page addressing deflector system 36 system which defines the angle at which the reference beam will impinge the surface of the recording media 10 and also the location thereof on the surface of the recording media 10. This is represented by a deflected reference beam 38.

As the two beams, the data beam and the reference beam, enter the recording media 10, the reference beam interferes with the data beam, writing an interference grating in the storage media 10. In the case of a photorefractive material, the grating pattern results from a stored electronic-charge pattern that modifies the optical properties of the crystallite. In the case of photopolymer material, certain areas of the photopolymer material are polymerized to form the interference grating. The result is a 3-D holographic image of the Fourier transform of the bit pattern carried in the data beam. This stored interference grating allows the original data beam to be recreated when the system reads the data. This process on which the interference grating is formed on the recording media 10 is basically the Write process for a holographic storage material.

The Write process is repeated a number of times, with the angle of the reference beam operable to be changed each time, to record a plurality of interference gratings. Each of the interference gratings is associated with a different input bit pattern, which interference gratings are superimposed over each other. This collection of superimposed recordings is called a stack. The recordings that comprise each of the stacks are angularly multiplexed within each of the stacks.

During a Read cycle, the data beam is shut off so that only the deflected reference beam 38 is input to the storage media 10 at the appropriate angle and location. The angle is determined by the desired page in that particular stack. The deflected reference beam 38 will be constructively diffracted by the interference grating that was recorded with a particular underlying spatial frequency that corresponds to the deflected reference beams particular angle. This results in a reconstructed image of the original bit pattern that stored there with a reference beam with that particular angle. The diffracted reference beam 39 or reconstructed data beam then passes through the storage media 10 into a focusing system 40 which focuses the reconstructed image onto the surface of a detector array 42 of, for example, a charge-coupled device that captures the reconstructed light and dark bit patterns of the image and then convert them back to digital electronic signals for transfer to a computer. This is represented by a data output line 44.

Referring now to FIG. 2, there is illustrated an exploded view of one embodiment of the storage media 10. The storage media of FIG. 2 utilizes a photopolymer, which photopolymer is a material that undergoes photo-induced polymerization. These compositions have been used to form conventional holograms. These are typically fabricated from a viscous or gelatin-like composition which is photo-reactive. When two laser beams intersect in this composition to set up an interference pattern, this causes selective polymerization within the material. These compositions typically contain a polymeric binder, a liquid ethylinically unsaturated monomer and a photoinitiator system. Typically, the layer of viscous or gelatin-like recording material is spun or web coated onto a substrate such as glass to provide a thin coating of approximately 20 microns. A capping layer of material such as Mylar ® is then disposed over the gelatin layer. This provides a relatively good optical surface on the upper surface of the gelatin layer, and the glass substrate provides a high quality optical surface on the bottom surface of the gelatin-like recording layer.

Returning to FIG. 2, an optically transmissive substrate 48 is provided over which an optically isolating perforated structural member 50 is disposed. The structural member 50 has a plurality of defined openings or wells 52 disposed therein, which wells 52 contain data storage regions 54. Each of the data storage regions 54 is separated from the other data storage region 54 by a predetermined distance. The structural member 50 is fabricated from a non-polymerizable material which is approximately 20 microns thick. In the preferred embodiment, the wells 52 are circular regions which are approximately equal to the diameter of the laser beam that impinges on the surface when reading or writing data to the storage media. The wells 52 are each operable to receive a storage area 54 of photopolymer material. An upper capping layer of Mylar ® 56 is provided.

Referring now to FIG. 3, there is illustrated a cross-sectional diagram of the assembled structure of FIG. 2. It can be seen that each of the wells 52 is arranged to hold photopolymer material that forms the data storage regions 54. The photopolymer material is therefore confined within the wells 52 and separated from adjacent storage regions 54 by the portion of the structure 50 that separates the wells 52. This is represented by the space 58 between each of the photopolymer material storage regions 54. When the data beam 39 and reference beam 38 are properly adjusted, they will impinge upon the surface and be aligned with respect to the surface of a select one of the photopolymer storage regions 54. This results in a number of benefits. First, the light is confined within the regions, since the index of refraction of the structure 50 and the photopolymer material in the isolated storage regions 54 is different. Second, since the isolated regions 54 are not in contact, monomer diffusion between regions is reduced. Thirdly, an increased structural rigidity is provided for a given region 54 such that a thicker layer of photopolymer can be accommodated. In general, with a large monolithic surface area layer, the thickness of the photopolymer must be limited due to the instability of the material, since it is in a gelatin state. However, the spaces 58 provide isolation and reduce the fluid motion of the polymer to accommodate a thicker layer, it being noted that the photopolymer material is a viscous material.

Figure 3A:
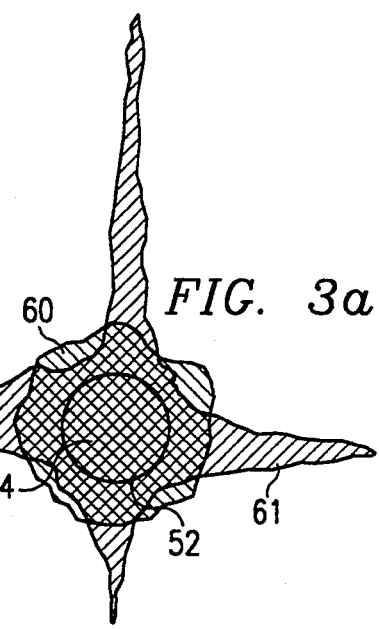
FIG. 3a illustrates a top view of one of the regions showing the spread of the beams beyond the overlapping record region.

Referring now to FIG. 3a, there is illustrated a top view of one of the isolated storage regions 54. Although illustrated as a perfect cylindrical beam in FIG. 3, the data beam 39 and reference beam 38 are not perfect cylinders. Rather, the light energy is distributed in an uneven pattern across each of the data and reference beams. The reference beam is typically round and the other, the data beam, representing a transform, which for the typical data patterns stored in the recording media being somewhat star shaped. This results in "bleed areas" 60 and 61 that exist outside of the isolated storage region 54 and the perimeter of the well 52. For relatively thick media, this can result in light scattering in other regions 54 and corrupting the data therein and wasting the recording dynamic range of the adjacent regions 54. This is especially so as the angle of incidence of the laser beam varies for addressing different pages of information. By providing the isolated storage regions 54, the scattering of light between adjacent data storage regions 54 is also minimized.

Figure 4A:
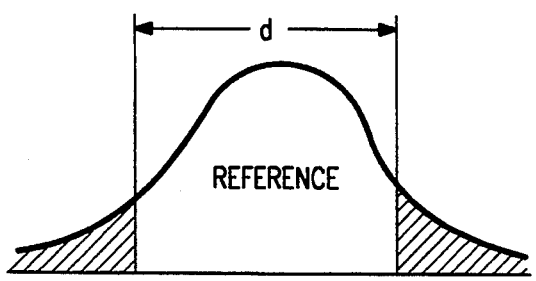
FIGS. 4a and 4b illustrate the intensity of the beams as a function of the distance across the regions.

Referring now to FIG. 4a, there is illustrated a curve representing the distribution of light energy across the beam. FIG. 4a illustrates the distribution across the reference beam 38, which distribution is generally a Gaussian distribution. It can be seen that a large part of the energy is disposed within the region having a diameter represented by "d". The portion outside of the diameter is relatively low energy and does not intersect with the data beam. However, this low energy light, although not utilized to form the interference grating in the storage region 54 or read the interference grating therefrom, can corrupt data in the other regions 54 during the Write operation, or provide extraneous noise during the Read operation.

Figure 4B:
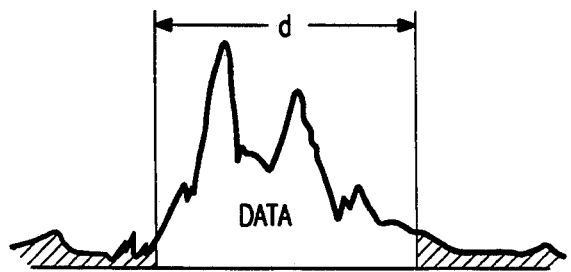

Referring now to FIG. 4b, there is illustrated a curve representing the distribution of light energy in the data beam 39. It can be seen that the distribution is more complex due to the pattern that is encoded and the transform nature of the data beam 39. However, the major portion of the light energy is disposed within the main diameter "d" of the beam and, thus, within the isolated storage region 54. Any light energy that occurs outside of the intersection of the data beam 39 and the reference beam 38 comprises the light energy in the bleed regions 60 and 61. The structure of the embodiment of FIGS. 2–3 contains the light energy and reduces the effect of this bleed region 60 on adjacent regions 54 such that the distance between regions 54 can be reduced.

Figure 5:
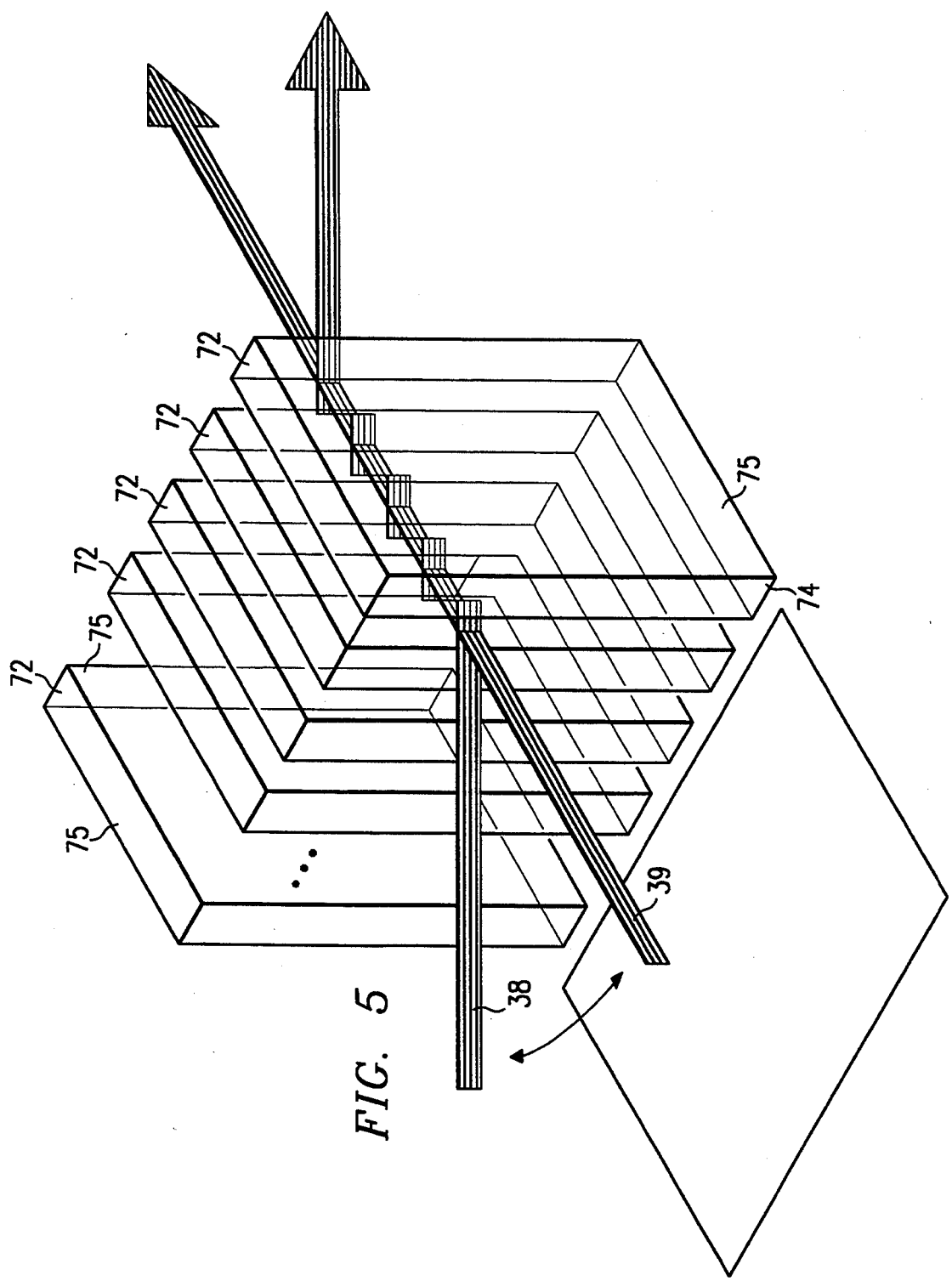
FIG. 5 illustrates an alternate embodiment utilizing slabs of photorefractive crystal which form isolated regions.

Referring now to FIG. 5, there is illustrated a one embodiment of the present invention which is directed more toward photorefractive storage medias. In general, the storage operation of photorefractive materials is described in U.S. Pat. No. 4,927,220, issued May 22, 1990 and entitled, "System and Method for Photorefractive Holographic Recording and Signal Processing", which patent is incorporated herein by reference. The system of FIG. 5 utilizes a plurality of slabs of photorefractive material or thick storage media which have an incident face 74 on one edge with the incident faces 74 of all of the slabs 72 disposed in the same plane. Each slab 72 has two side faces 75 perpendicular to the incident face 72. The incident face 74 provides the incident surface for both the reference beam 38 and the data beam 39. However, an important aspect of the present invention is that the reference beam 38 and the data beam 39 are disposed in a single plane that is both perpendicular to the incident surface 74 and also perpendicular to the side faces 75 of the slab 72. The slabs 72 are separated from each other by a predetermined distance and the data beam is oriented such that when the data beam 39 passes through the slab 72, it will not bleed over into an adjacent slab or even interact with the side faces 75. The angles are such that they will be internally reflected off the side faces 75. The reference beam 38, which is disposed at a range of angles, one for each superimposed recording, all at greater angles. Therefore, there is a substantially total isolation between adjacent slabs. In the vertical direction within a slab, there will be some bleed, but the reference beam 38 being perpendicular to the face 75 results in little dispersion of the light in a vertical direction. This internal confinement of the reference beam by the side 75 results in a long overlap region between the data and the reference beam.

Figure 6:
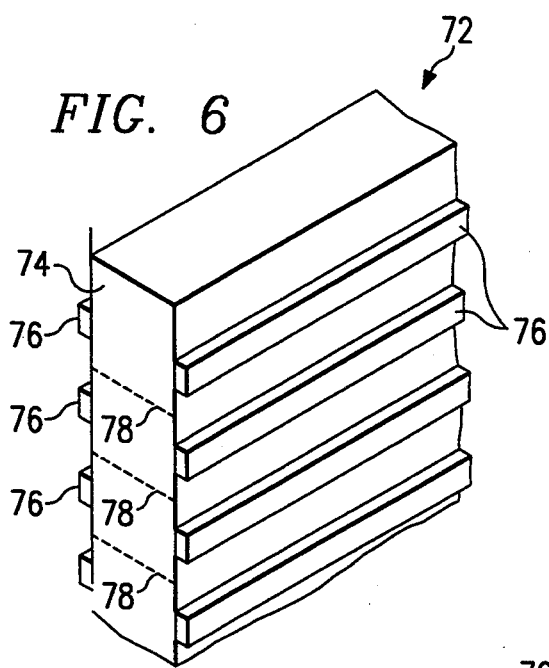
FIG. 6 illustrates a detail of the electrode structure about one of the slabs of photorefractive crystal.

Referring now to FIG. 6, there is illustrated a detail of the slab 72 of FIG. 5, illustrating a plurality of electrodes 76 disposed on the sides thereof. The electrodes 76 are required in order to enhance the recording sensitivity of select regions within a given slab, the regions being disposed in a vertical manner. These regions are defined by dotted lines 78. Each one of the regions has an electrode 76 on either side thereof disposed along the length of the region. These electrodes 76 can be disposed at the appropriate voltage to allow data to be recorded to the photorefractive crystal material or read therefrom. This is conventional. In general, the electrode 76 can be formed on the side thereof by a technique of depositing metallization thereon and then etching the metallization into a longitudinal electrode member or by attaching the electrode thereto by an adhesive process.

Figure 7:
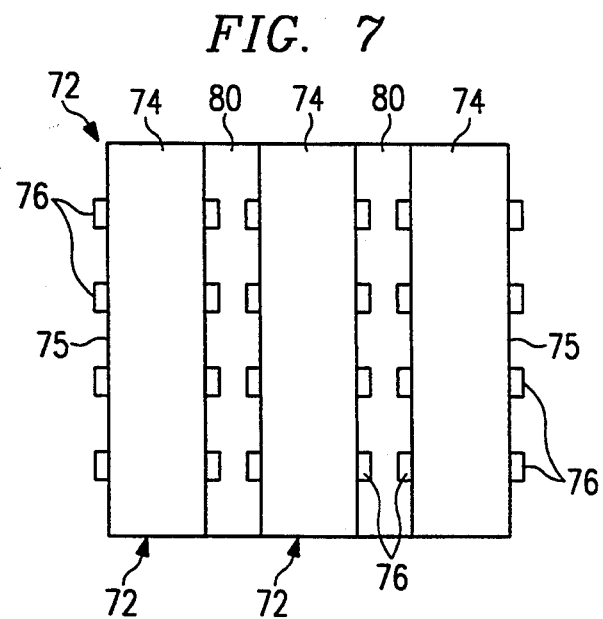
FIG. 7 illustrates a cross-sectional detail of the slab assembly with the insulating layer disposed therebetween.

Referring now to FIG. 7, there is illustrated a detailed end view of the structure of FIG. 5, illustrating an insulated layer 80 disposed between adjacent ones of the slabs 72. The insulating layer is an electrically insulating layer that provides both a separating function and also an electrical isolating function. Additionally, the thickness of the isolating layer 80 provides some separation to prevent the bleed from the laser beams entering into the incident face 74 and bleeding over into an adjacent slab. However, the internal reflection along the face 75 will allow a thicker media to be utilized. Although a photorefractive crystal is described, the structure of FIG. 5 can be utilized with any type of thick holographic storage media in which an interference grating can be stored. The photorefractive crystal allows it to be stored in a Read/Write mode.

Figure 8:
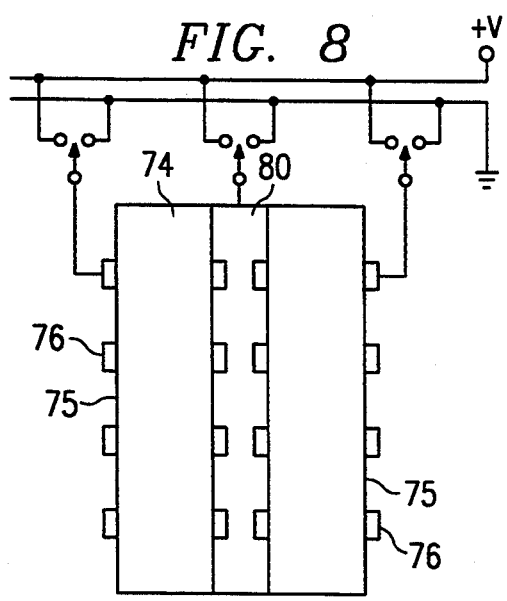
FIG. 8 illustrates an alternate embodiment of the slab assembly of FIG. 7.

An alternate method for disposing the electrodes is to shape them between adjacent slabs by allowing sets of electrodes to be connected to either a positive voltage or to a ground voltage, as illustrated in FIG. 8, wherein adjacent ones of the slabs would share a common electrode. However, a photopolymer material could be utilized wherein the polymerization procedure allows data only to be written one time and then read many times. Of course, the photopolymer would not utilize electrodes.

In summary, there has been provided a method and apparatus for forming a holographic storage media with selected storage regions disposed thereon in an isolated manner. Regions within the storage media are physically isolated by placing barriers between the regions. In one embodiment, strips of a storage medium are formed which are separated by a barrier to provide internal reflection along the barriers. This technique is utilized with thick storage mediums such that the reference beam will be disposed in a plane perpendicular to the surface of the media and also to the surface of the barrier. This will allow the data beam and the reference beam to experience total internal reflection in the horizontal direction, such that light will not pass to adjacent regions and also will not traverse along a given strip.

Although preferred embodiments have been described in detail, it should be understood that various changes, substitutions and alterations can be made therein without departing from the spirit and scope of the invention as defined by the appended claims.

What is claimed is:

1. A thick holographic storage medium for use in an optical recording system, comprising:

a plurality of slabs of holographic storage media, each of said slabs having two parallel sides, an incident face perpendicular to said sides for receiving reference and data laser beams for a Read/Write operation within said storage media and a diametrically opposed face substantially parallel to said incident face for allowing said reference and data beams to exit said storage media, said storage media operable to store data interference gratings that are formed by the interference between the received data and reference beams during a Write operation, and store data read out by passing said reference beam through said storage media at substantially the same angle at which data was recorded, each of said slabs having a plurality of discrete storage regions associated therewith, which said storage regions are addressable by directing said data and reference laser beams onto the associated portion of said incident face; and a support structure for disposing said slabs in an adjacent relationship with the parallel faces of adjacent ones of said slabs disposed a predetermined distance apart;

said slabs having both of said parallel sides and said incident faces oriented such that they are perpendicular to the plane of the data and reference laser beams.

2. The storage medium of claim 1, wherein said holographic storage media comprises photorefractive crystal and each slab further comprises means for selectively accessing each of said storage regions within each of said slabs.

3. The storage medium of claim 2, wherein said means for selectively accessing comprises electrodes disposed on the surfaces of the portion of said two parallel faces associated with each of said regions such that a voltage can be disposed thereacross.

4. An optical data storage system, comprising:

a coherent light source;

a device for splitting the light beam output by said light source into a data beam and a reference beam;

a Write device for encoding data onto the data beam;

a steering device for directing said reference beam to intersect the data beam to cause an interference grating at said intersection;

a holographic storage medium having a recording surface disposed at the plane of said reference and data beams;

said steering device operable to steer said intersection to a select location on the surface of said storage medium, said data and reference beams disposed in a common plane relative to the surface of said holographic storage medium; and said holographic storage medium comprising:

a plurality of slabs of holographic storage media, each of said slabs having two parallel sides, an incident face perpendicular to said sides for receiving reference and data laser beams for a Read/Write operation within said storage media and a diametrically opposed face substantially parallel to said incident face for allowing said reference and data beams to exit said storage media, said storage media operable to store data interference gratings that are formed by the interference between the received data and reference beams during a Write operation, and store data read out by passing said reference beam through said storage media at substantially the same angle at which data was recorded, each of said slabs having a plurality of discrete storage regions associated therewith, which said storage regions are addressable by directing said data and reference laser beams onto the associated portion of said incident face, a support structure for disposing said slabs in an adjacent relationship with the parallel faces of adjacent ones of said slabs disposed a predetermined distance apart, and said slabs having both of said parallel sides and said incident faces oriented such that they are perpendicular to the plane of the data and reference laser beams;

means for selectively accessing one of said storage regions in the select ones of said slabs with said steering device for either writing data thereto or reading data therefrom; and a detector for reading a reconstructed data beam on a Read operation wherein only said reference beam is generated.

5. The optical storage system of claim 4, wherein said holographic storage media comprises photorefractive crystal and each slab further comprises means for selectively accessing each of said storage regions within each of said slabs.

6. The optical storage system of claim 4, wherein said means for selectively accessing comprises electrodes disposed on the surfaces of the portion of said two parallel faces associated with each of said regions such that a voltage can be disposed thereacross.

7. A method for storing information in a thick holographic storage medium, comprising:

forming a plurality of slabs of holographic storage media, each of the slabs having two parallel sides, an incident face perpendicular to the sides for receiving reference and data laser beams for a Read/Write operation within the storage media and a diametrically opposed face substantially parallel to the incident face for allowing the reference and data beams to exit the storage media, the storage media operable to store data interference gratings that are formed by the interference between the received data and reference beam during a Write operation and store data Read out by passing the reference beam through the storage media at substantially the same angle at which data was recorded, each of the slabs having a plurality of discrete storage regions associated therewith, which storage regions are addressable by directing the data and reference data beams onto the associated portion of the incident face;

supporting the slabs in an adjacent relationship with the parallel faces of adjacent slabs disposed a predetermined distance apart such that the parallel sides and incident faces are oriented perpendicular to the plane of the data and reference laser beams;

storing data in the storage media by passing the data laser beam through a select one of the storage regions and passing the reference laser beam through the same storage region at an angle to the data laser beam; and reconstructing data stored in the storage media by passing only a reference laser beam through the storage media at a predetermined angle which corresponds to the angle at which the reference laser beam interfered with the data laser beam during recording of the data in the storage media.

8. The method of claim 7, wherein the holographic storage media comprises photorefractive crystal and further comprising the step of accessing a select one of the storage regions by activating the photorefractive crystal proximate to the select one of the regions.

9. The method of claim 8, wherein the step of selectively accessing comprises disposing electrodes on the surfaces of the portion of the two parallel faces associated with each of the regions and disposing a voltage across the electrodes associated with the select ones of the regions.

* * * * *